(12) United States Patent
Quevy et al.

(10) Patent No.: US 9,246,412 B2
(45) Date of Patent: *Jan. 26, 2016

(54) SUSPENDED PASSIVE ELEMENT FOR MEMS DEVICES

(71) Applicant: Silicon Laboratories Inc., Austin, TX (US)

(72) Inventors: Emmanuel P. Quevy, El Cerrito, CA (US); Daniel N. Koury, Jr., Mesa, AZ (US)

(73) Assignee: Silicon Laboratories Inc., Austin, TX (US)

( * ) Notice: Subject to any disclaimer, the term of this patent is extended or adjusted under 35 U.S.C. 154(b) by 106 days.

This patent is subject to a terminal disclaimer.

(21) Appl. No.: 14/029,931

(22) Filed: Sep. 18, 2013

(65) Prior Publication Data

US 2014/0361844 A1 Dec. 11, 2014

Related U.S. Application Data

(60) Provisional application No. 61/831,324, filed on Jun. 5, 2013.

(51) Int. Cl.
*H03L 1/02* (2006.01)
*H02N 1/00* (2006.01)
(Continued)

(52) U.S. Cl.
CPC ................ *H02N 1/00* (2013.01); *B81B 3/0081* (2013.01); *H03B 5/30* (2013.01); *H03H 3/013* (2013.01); *H03H 9/02259* (2013.01); *H03L 1/02* (2013.01); *H03L 1/04* (2013.01); *H03H 2007/006* (2013.01); *H03H 2009/0248* (2013.01); *H03H 2009/02291* (2013.01);
(Continued)

(58) Field of Classification Search
CPC .................................. H03B 5/30; H03L 1/02
USPC ..................................... 331/117 R, 154, 158
See application file for complete search history.

(56) References Cited

U.S. PATENT DOCUMENTS 5,156,460 A 10/1992 Norling et al.
5,914,553 A * 6/1999 Adams et al. ................. 310/309
(Continued)

OTHER PUBLICATIONS

Perrott, Michael H., "A Temperature-to-Digital Converter for a MEMS-Based Programmable Oscillator With < ±0.5-ppm Frequency Stability and < 1-ps Integrated Jitter," IEEE Journal of Solid-State Circuits, vol. 48, No. 1, Jan. 2013, pp. 276-291.

(Continued)

*Primary Examiner* — Jeffrey Shin
(74) *Attorney, Agent, or Firm* — Abel Law Group, LLP

(57) ABSTRACT

A technique decouples a MEMS device from sources of strain by forming a MEMS structure with suspended electrodes that are mechanically anchored in a manner that reduces or eliminates transfer of strain from the substrate into the structure, or transfers strain to electrodes and body so that a transducer is strain-tolerant. The technique includes using an electrically insulating material embedded in a conductive structural material for mechanical coupling and electrical isolation. An apparatus includes a MEMS device including a first electrode and a second electrode, and a body suspended from a substrate of the MEMS device. The body and the first electrode form a first electrostatic transducer. The body and the second electrode form a second electrostatic transducer. The apparatus includes a suspended passive element mechanically coupled to the body and electrically isolated from the body.

21 Claims, 14 Drawing Sheets

(51) Int. Cl.
  *H03B 5/30* (2006.01)
  *H03H 3/013* (2006.01)
  *H03H 9/02* (2006.01)
  *B81B 3/00* (2006.01)
  *H03L 1/04* (2006.01)
  *H03H 7/00* (2006.01)
  *H03H 9/24* (2006.01)

(52) U.S. Cl.
  CPC ............... *H03H 2009/02385* (2013.01); *H03H 2009/2442* (2013.01); *Y10T 29/49005* (2015.01); *Y10T 29/49117* (2015.01)

(56) References Cited

U.S. PATENT DOCUMENTS

| | | | |
|---|---|---|---|
| 6,122,963 | A | 9/2000 | Hammond et al. |
| 6,239,473 | B1 | 5/2001 | Adams et al. |
| 6,342,430 | B1 | 1/2002 | Adams et al. |
| 7,514,760 | B1 | 4/2009 | Quevy |
| 7,639,104 | B1 | 12/2009 | Quevy et al. |
| 8,056,415 | B2 | 11/2011 | McNeil et al. |
| 8,258,893 | B2 | 9/2012 | Quevy et al. |
| 8,723,611 | B2 | 5/2014 | Kaajakari |
| 2007/0268095 | A1* | 11/2007 | Chou ............................ 333/262 |
| 2008/0135385 | A1* | 6/2008 | Steeneken et al. ............ 200/181 |
| 2013/0002363 | A1 | 1/2013 | Motiee et al. |
| 2014/0361843 | A1* | 12/2014 | Quevy et al. .................... 331/70 |
| 2014/0361844 | A1 | 12/2014 | Quevy et al. |

OTHER PUBLICATIONS

U.S. Appl. No. 13/075,800, filed Mar. 30, 2011, entitled "Technique for Forming a MEMS Device," by Emmanuel P. Quevy, et al.

U.S. Appl. No. 13/075,806, filed Mar. 30, 2011, entitled "Technique for Forming a MEMS Device Using Island Structures," by Emmanuel P. Quevy and Carrie W. Low.

* cited by examiner

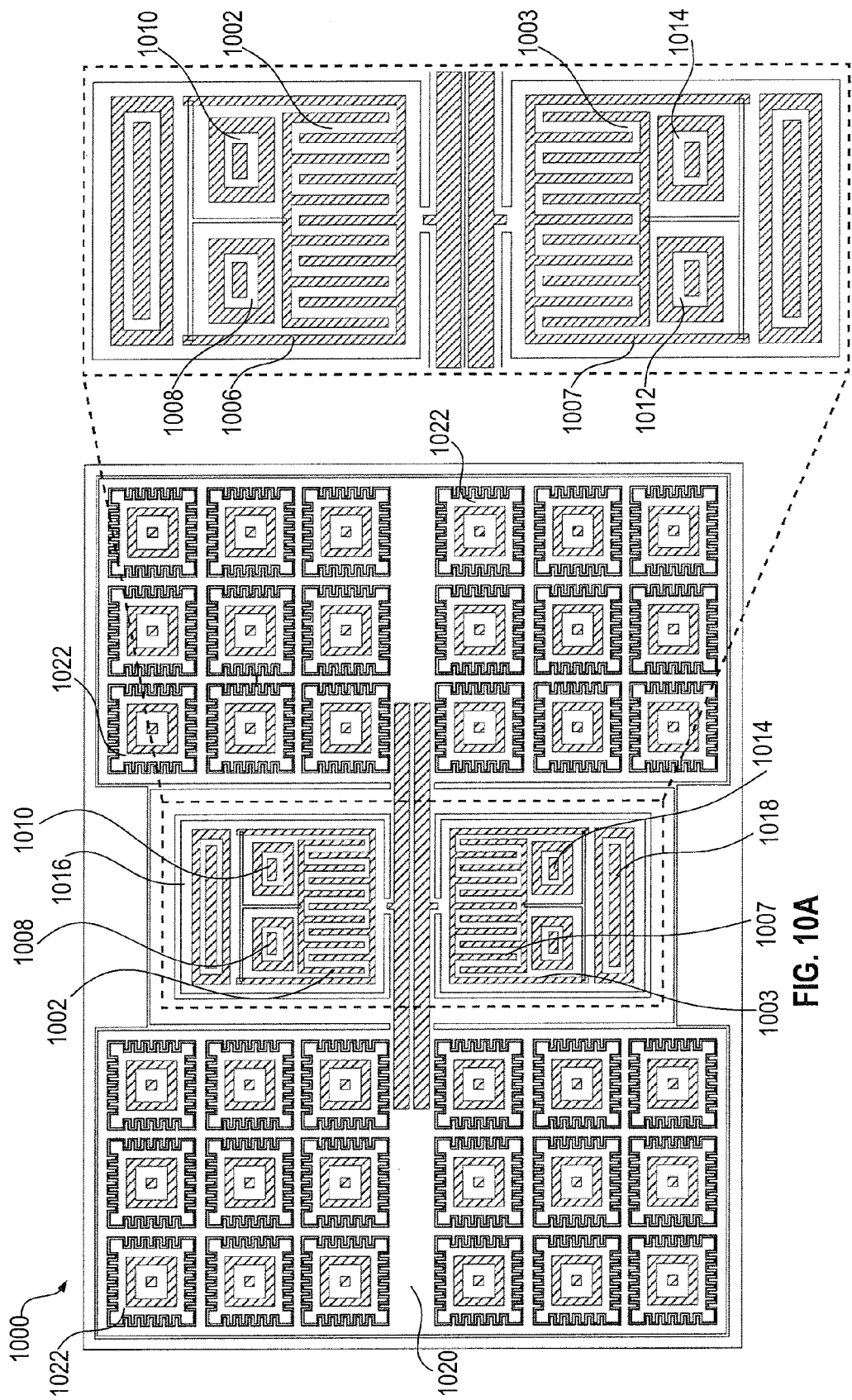

SUSPENDED PASSIVE ELEMENT FOR MEMS DEVICES

CROSS REFERENCE TO RELATED APPLICATIONS

This application claims benefit under 35 U.S.C. §119 of provisional application No. 61/831,324, entitled "Monolithic Body MEMS Devices," filed Jun. 5, 2013, which application is hereby incorporated by reference.

BACKGROUND

1. Field of the Invention

The invention is related to microelectromechanical systems (MEMS).

2. Description of the Related Art

In general, microelectromechanical systems (MEMS) are very small mechanical devices. Typical MEMS devices include sensors and actuators, which may be used in various applications, e.g., resonators (e.g., oscillators), temperature sensors, pressure sensors, or inertial sensors (e.g., accelerometers or angular rate sensors). The mechanical device is typically capable of some form of mechanical motion and is formed at the micro-scale using fabrication techniques similar to those utilized in the microelectronic industry, such as using lithography, deposition, and etching processes.

In general, a MEMS transducer converts energy between different forms, e.g., electrostatic and mechanical forms. MEMS transducers may be used as both sensors that convert motion into electrical energy (accelerometers, pressure sensors, etc.) and actuators that convert electrical signals to motion (comb drive, micromirror devices, resonators). MEMS devices using capacitive transducers are easy to manufacture and result in low noise and low power consumption sensors and/or actuators.

Capacitive sensing is based on detecting a change in capacitance of a capacitor. If a known voltage is applied across the capacitor (e.g., fixed DC potential differences applied across the capacitors a the MEMS device), changes in current due to capacitive variations will appear in response to motion of one plate of the capacitor relative to another plate of the capacitor. Similarly, capacitive actuation is based on variation in electrostatic forces between the two plates of a MEMS capacitive transducer. For example, a DC operating point can be established by applying a DC bias voltage across the capacitor and an AC voltage causing changes in force on a plate of the capacitor. Transduction of a MEMS device is based on the voltage across the transduction gap generating an electrostatic force, or inversely, transduction based on the gap variation due to displacement generating a charge variation at the output of the transducer. The transduction gap may vary as a function of environmental factors (e.g., temperature, strain, and aging), thereby changing the capacitance with respect to time. These same environmental factors can also affect the spring constant (i.e., spring stiffness) associated with a MEMS device, which is typically modeled as a mass-spring-damper system. In general, a change in the electrode capacitance affects the equivalent spring stiffness through electrostatic pulling, which affects the resonant frequency of the MEMS device. MEMS devices targeting applications requiring high-precision (e.g., resonators having resonant frequency specifications required to be within +/−10 parts-per-million (ppm)) may not achieve the target specification due to effects of environmental factors on the resonant frequency.

A MEMS device may be configured as a resonator that is used in timing devices. The resonator may have a variety of physical shapes, e.g., beams and plates. The MEMS device may have a portion suspended from the substrate (e.g., a suspended mass, body, or resonator) attached to the substrate by an anchor. An exemplary suspended mass may be a feature such as, but not limited to, a beam, a plate, a cantilever arm, or a tuning fork. In a specific embodiment, a MEMS device includes a resonating feature (e.g., suspended mass) flanked by one or more drive electrodes and one or more sense electrodes.

Referring to FIG. 1, a conventional MEMS device (e.g., MEMS device 100) includes resonator 105 coupled to substrate 102 via anchor 104. During operation, electrode 110 electrostatically drives resonator 105 to dynamically deflect, which increases a capacitance between resonator 105 and electrode 110 when a voltage differential exists between resonator 105 and electrode 110 by decreasing the gap between resonator 105 and electrode 110. Since electrode 110 and resonator 105 are the same height and thickness and are in the same plane, resonator 105, when driven, deforms laterally, i.e., parallel to the plane of the substrate, across a distance between electrode 110 and a second electrode 111. Electrode 110 is substantially parallel to substrate 102. Electrode 111 detects the resonant frequency of resonator 105 as the capacitance varies between resonator 105 and electrode 111 in response to the deflection driven by electrode 110. MEMS device 100 is commonly referred to as an "in-plane" or "lateral" mode resonator because resonator 105 is driven to resonate in a mode where the resonator 105 moves laterally (in direction 109) and remains aligned vertically with electrode 110.

Referring to FIG. 2, in an exemplary MEMS application, MEMS device 100 is coupled to amplifier 210 in an oscillator configuration. Sense electrode 202 provides a signal based on energy transfer from a vibrating resonator of MEMS device 100, thereby converting mechanical energy into an electrical signal. In general, bias signals introduced at various points of the circuit determine an operating point of the circuit and may be predetermined, fixed DC voltages or currents added to AC signals. The resonator of MEMS device 100 receives a DC bias voltage, $V_{MASS}$, which is generated by a precision voltage reference or voltage regulator of bias generator 206. However, in other embodiments, bias signals may be introduced at the electrodes and/or other nodes of the oscillator circuit. A large feedback resistor ($R_F$) biases amplifier 210 in a linear region of operation, thereby causing amplifier 210 to operate as a high-gain inverting amplifier. The MEMS oscillator sustains vibrations of MEMS device 100 by feeding back the output of amplifier 210 to a drive electrode of MEMS device 100. Amplifier 210 receives a small-signal voltage from sense electrode 202 and generates a voltage on drive electrode 204 that causes the resonator of MEMS device 100 to continue to vibrate. MEMS device 100 in combination with capacitances $C_1$ and $C_2$ form a pi-network band-pass filter that provides 180 degrees of phase shift and a voltage gain from drive electrode 204 to sense electrode 202 at approximately the resonant frequency of MEMS device 100.

For some MEMS applications (e.g., a low-power clock source), a low-power, high-Q (i.e., quality factor), stable, and accurate oscillator may be required. However, the power, accuracy, and stability specifications may be difficult to achieve using the conventional MEMS device of FIG. 1. Accordingly, improved MEMS devices, e.g., MEMS devices that reduce or eliminate factors that affect accuracy and reliability of the output frequency of the MEMS device, are desired.

SUMMARY

A technique decouples a microelectromechanical system (MEMS) device from sources of strain by forming a MEMS structure with suspended electrodes that are mechanically anchored in a manner that reduces or eliminates transfer of strain from the substrate into the structure, or transfers strain to electrodes and body so that a transducer is strain-tolerant. The technique includes using an electrically insulating material embedded in a conductive structural material for mechanical coupling and electrical isolation.

In at least one embodiment of the invention, an apparatus includes a MEMS device including a first electrode and a second electrode, and a body suspended from a substrate of the MEMS device. The body and the first electrode form a first electrostatic transducer. The body and the second electrode form a second electrostatic transducer. The apparatus includes a suspended passive element mechanically coupled to the body and electrically isolated from the body. The suspended passive element may be a suspended resistor including a serpentine structural material portion attached to electrically insulating material portions. The apparatus may include a circuit including the suspended resistor and configured to detect a temperature change of the MEMS device. The apparatus may include a circuit including the suspended resistor and configured to adjust a temperature of the MEMS device. The suspended passive element may be mechanically coupled to a central beam of the body. The suspended passive element may be a suspended inductor mechanically coupled to the body and electrically isolated from the body. The suspended inductor may include a planar spiral structural material portion attached to electrically insulating material portions.

In at least one embodiment of the invention, a method of manufacturing an apparatus includes forming a MEMS device including a first electrode and a second electrode, and a body suspended from a substrate of the MEMS device. The body and the first electrode form a first electrostatic transducer. The body and the second electrode form a second electrostatic transducer. The method includes forming a suspended passive element mechanically coupled to the body and electrically isolated from the body. The suspended passive element may be a suspended resistor including a serpentine structural material portion attached to electrically insulating material portions. Forming the MEMS device may include forming a structural layer using the substrate. Forming the suspended passive element may include forming electrical insulator material embedded in the structural layer. Forming the suspended passive element may include releasing the structural layer. The method may include forming a circuit portion configured to detect a temperature change of the MEMS device using the suspended passive element. The method may include forming a circuit portion, configured to adjust a temperature of the MEMS device using the suspended passive element. The suspended passive element may be a suspended inductor mechanically coupled to the body and electrically isolated from the body. The suspended passive element may be mechanically coupled to a central beam of the body. The suspended passive element may be formed from a structural material having a low resistivity. The suspended inductor may include a planar spiral structural material portion attached to electrically insulating material portions.

BRIEF DESCRIPTION OF THE DRAWINGS

The present invention may be better understood, and its numerous objects, features, and advantages made apparent to those skilled in the art by referencing the accompanying drawings.

FIGS. 10A and 10B illustrate a suspended resistor device consistent with at least one embodiment of the invention.

The use of the same reference symbols in different drawings indicates similar or identical items.

DETAILED DESCRIPTION

Referring back to FIG. 1, MEMS device 100 may be modeled as a spring-mass system having a resonant frequency, $$f_0 = \frac{1}{2\pi}\sqrt{\frac{k}{m}},$$

where k is a constant indicative of the spring stiffness, m is mass of the resonator, and $f_0$ is the resonant frequency. In general, the quality factor, Q, characterizes a resonator's bandwidth relative to its center frequency. The quality factor may be represented as $Q=2\pi f_o m/\gamma$, where $\gamma$ is damping coefficient (e.g., due to fluid in a cavity surrounding the mass). A higher Q indicates a lower rate of energy loss relative to the stored energy of the resonator, i.e., oscillations die out more slowly. An oscillator with a higher Q resonates with higher amplitude but for a smaller range of frequencies around that frequency over smaller bandwidth. To achieve a high-precision, low-power resonator, a high mass may be desired so that the device can have a high stiffness. Increasing mass m increases the quality factor of the resonator if the other relevant parameters for Q are held constant. To maintain a particular resonant frequency, an increase in m requires a corresponding increase in k. Other design goals for particular MEMS applications may include low-frequency operation (e.g., $f_0<1$ MHz) and insensitivity to shocks to the housing of the MEMS oscillator. A high stiffness reduces sensitivity to resonator voltage and reduces nonlinearities in operation. However, device characteristics influencing transducer linearity and mechanical stiffness can be altered by environmental changes, which may affect the initial accuracy of frequency and stability of frequency in response to aging and temperature variation.

Figure 1:
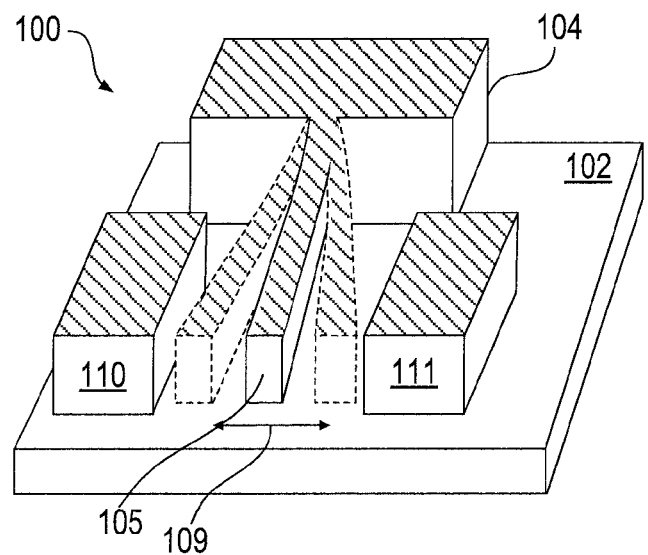
FIG. 1 illustrates a conventional MEMS device including an in-plane resonator.
Figure 2:
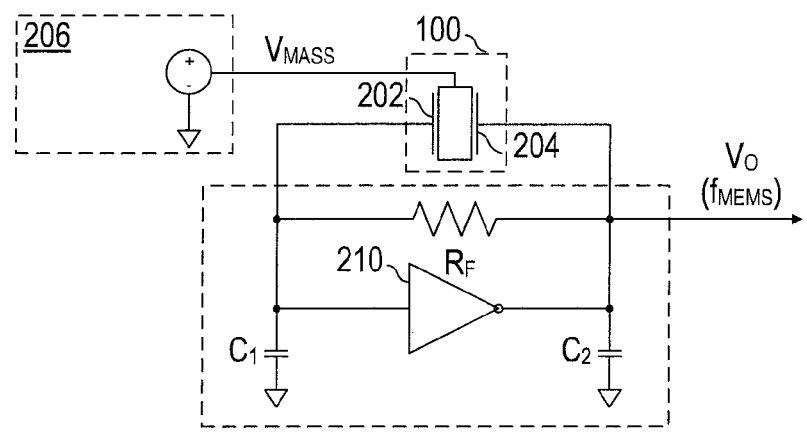
FIG. 2 illustrates a circuit diagram of a MEMS device configured as an oscillator.

The typical MEMS device of FIG. 1 is made of a movable free standing body, and one or more electrodes, all of which may be at different electrical potentials. A combination of an electrode and a body forms an electro-mechanical transducer. The electrostatic transducer formed by an electrode and mass is subjected to environmental factors like temperature variation and mechanical strain which can influence its properties and in turn affects critical performance of the overall MEMS device, like initial accuracy. The typical MEMS device uses two separate bodies for an electrode and a movable mass. In general, these bodies are anchored separately from each other and as a result, the transducer gap formed between the two (having a width d) is susceptible to strain resulting from residual stress from the structural layer, coefficient of thermal expansion mismatch between a structural layer (e.g., SiGe) and the substrate (e.g., Si), and/or stress from the package, which will generally vary with temperature, and possibly with time (e.g., stress relaxation).

Such variation in transducer properties impacts electromechanical behavior and may manifest itself in frequency variation due to strain in resonator applications or acceleration offset and sensitivity in inertial sensor applications and may limit performance or tolerances of a MEMS system. For example, in a typical MEMS resonator application, a MEMS oscillator may be calibrated to meet a +/−10, 20, or 50 parts-per-million (ppm) at room temperature and over temperature. If the transducer is sensitive to strain, package strain variations due to solder reflow or temperature variations will modify the electrostatic force of the transducer, which affects the resonant frequency of the device. Frequency variation due to strain variation may result in the MEMS resonator failing to meet a target specification.

Ideally, to reduce the effects of strain on a MEMS device, electrode anchors and resonator anchors can be placed as close to each other as practical. As referred to herein, an anchor is a structure that mechanically couples (e.g., anchors, fixes, fastens, joins, connects, or attaches) a portion of a first structure to a portion of a second structure. Portions of the first and second structures that are mechanically coupled have restricted motion. In conventional MEMS devices, locating the electrode anchors and resonator anchors in the same location on a substrate is not typically feasible. Therefore, the electrode and resonator anchors of the MEMS device are located in close proximity (e.g., as close as allowable by design constraints (e.g., design rules) for the target manufacturing process) to reduce sensitivity of MEMS device to the effects of strain on the MEMS device. Transduction of the MEMS device is often based on the voltage difference across the transduction gap (i.e., the voltage difference between the mass and the electrode, $V_{ME}$). For example, the transduction gap of an exemplary MEMS device is defined by the distances between the capacitive fingers of the resonator and corresponding capacitive fingers of an electrode, which may be equal. Those distances may vary as a function of strain, causing a change to the capacitive transduction of MEMS device and thus causing a change to the resonant frequency.

A technique decouples transducers of the MEMS device from sources of strain by forming a MEMS structure with suspended electrodes that are mechanically anchored in a manner that reduces or eliminates the transfer of strain from the substrate into the structure (e.g., by using one or more center anchor structure), or transfers strain to both electrodes and body in such a way that the transducer is strain-tolerant. The technique includes using an electrical insulator material (e.g., $SiO_2$) embedded in a conductive structural material (e.g., SiGe) both for mechanical coupling and electrical isolation. As referred to herein, a structural layer is a layer of a particular material that is later patterned and at least partially released to form at least a portion that is free to mechanically move or be deflected in at least one direction with respect to a surface of a substrate. As referred to herein, a release of a structure or a portion of a structural layer frees that structure or portion of the structural layer to have a portion that is free to mechanically move or be deflected in at least one directional plane with respect to the substrate. A release layer is a layer of material that, when removed, releases at least a portion of the structure or structural layer. The release typically occurs towards the end of manufacture to maintain integrity of the released structures.

The embedded electrical insulator material may also be used for temperature compensation of MEMS devices, which is described in U.S. Pat. No. 7,639,104, filed Mar. 9, 2007 (issued Dec. 29, 2009), entitled "Method for Temperature Compensation in MEMS Resonators with Isolated Regions of Distinct Material," naming Emmanuel P. Quevy et al., as inventors, which application is incorporated herein by reference. The embedded electrical insulator material may be used to electrically isolate specific areas of the structural layer. The embedded electrical insulator may be used to route different signals through the structural layer while keeping a continuous (i.e., monolithic) mechanical body. Although the technique is described using silicon dioxide, other electrically insulating materials may be used. Techniques for forming the electrically insulating material structures (e.g., embedded silicon dioxide slits) are described in U.S. Pat. No. 7,639,104 and described in U.S. Pat. No. 7,514,760, entitled "IC-Compatible MEMS Structure" naming Emmanuel P. Quevy as inventor, filed Mar. 9, 2007, issued Apr. 7, 2009, which application is incorporated herein by reference.

One or more embedded electrical insulator slits may be used to route signals and perform electrical, thermal, and mechanical functions simultaneously. In at least one embodiment of a MEMS device, embedded insulator material is used to form a monolithic MEMS device, which includes a self-referenced transducer gap, i.e., the electrode and movable body are mechanically coupled to move together, thereby reducing the impact of environmental strain. In at least one embodiment of a MEMS device formed using embedded insulator material, an electrode is part of the movable body and contributes to the mode shape. In at least one embodiment of a MEMS device formed using embedded insulator material, the electrode is a movable body and contributes to the relative displacement of body versus electrode. As a result, those MEMS devices may have more compact designs with higher performance (e.g., higher signal-to-noise ratio versus area). In addition, the embedded electrical insulator material slit technique allows the routing of separate signals within the same structural layer.

Figure 3:
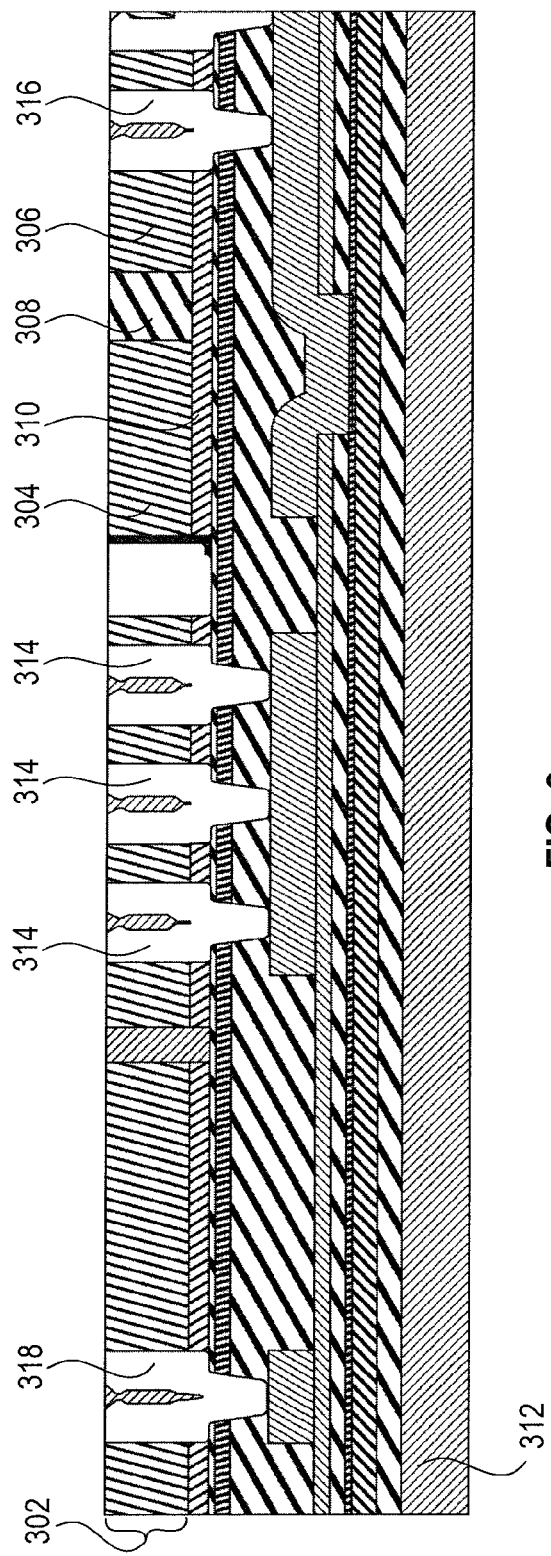
FIG. 3 illustrates an exemplary cross-sectional view of a MEMS structure prior to a release of a structural layer to form suspended portions consistent with at least one embodiment of the invention.

Referring to FIG. 3, an exemplary MEMS device that achieves high-Q operation is manufactured using techniques that form body and electrode structures that are suspended from a substrate. Manufacturing techniques that may be used to produce MEMS devices are described in U.S. Pat. No. 7,514,760, filed Mar. 9, 2007, entitled "IC-Compatible MEMS Structure," naming Emmanuel P. Quevy as inventor; U.S. patent application Ser. No. 13/075,800, filed Mar. 30, 2011, entitled "Technique for Forming a MEMS Device," naming Emmanuel P. Quevy et al., as inventors; and U.S. patent application Ser. No. 13/075,806, filed Mar. 30, 2011, entitled "Technique for Forming a MEMS Device Using Island Structures," naming Emmanuel P. Quevy et al., as inventors, which applications are incorporated herein by reference. For example, structural layer 302 includes structural portions 304 and 306 that are electrically isolated, but mechanically coupled to each other using embedded isolation oxide 308. Upon release of the structural material, structural portions 304 and 306 are suspended from substrate 312. Structural portions are electrically coupled to electrical domains using electrical contact structures 314, 316, and 318. Signals may be routed using embedded insulator portions, while maintaining a continuous (i.e., monolithic) mechanical body as discussed further below.

Figure 4A:
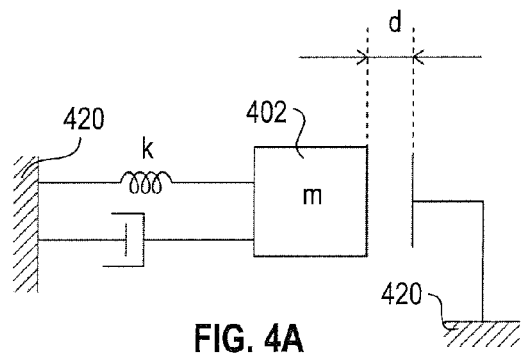
FIG. 4A illustrates a diagram modeling a typical MEMS transducer.

Referring to FIG. 4A, a typical electrostatic transducer includes a movable mass 402 anchored to a substrate 420 and a movable electrode anchored to the substrate 420. The electrostatic transducer has a transducer gap, d, a resonator-electrode voltage $V_{re}$, a resonator-electrode capacitance $C_{re}$, and has an efficiency of $$\Gamma = V_{re} \frac{\partial C_{re}}{\partial x} \frac{\partial x}{\partial t},$$

where $$C_{re} = \frac{\varepsilon_0 A}{d_0 - x}$$

and $$\left.\frac{\partial C_{re}}{\partial x}\right|_{x=0} = \frac{C_{re}(0)}{d_0}.$$

Frequency variation due to strain, etc., results in a resonant frequency of $$f_{osc} = f_{mech} * \sqrt{1 - \beta(d)V^2},$$

where strain dependence (from residual stress and thermal stress) of frequency accuracy is $$\delta\varepsilon(\sigma, T) = \frac{\varepsilon}{d_0}.$$

The resulting frequency shift due to strain is:

$$\frac{\Delta f}{f}(\delta\varepsilon) \sim \frac{1}{2} \cdot \frac{3\delta\varepsilon \cdot \beta(d_0) \cdot V^2}{1 - \beta(d_0) \cdot V^2}.$$

Frequency control applications may attempt to reduce or eliminate this frequency shift by reducing or eliminating the frequency variation due to strain and/or reducing or eliminating the strain communicated to the device transducer.

Figure 4B:
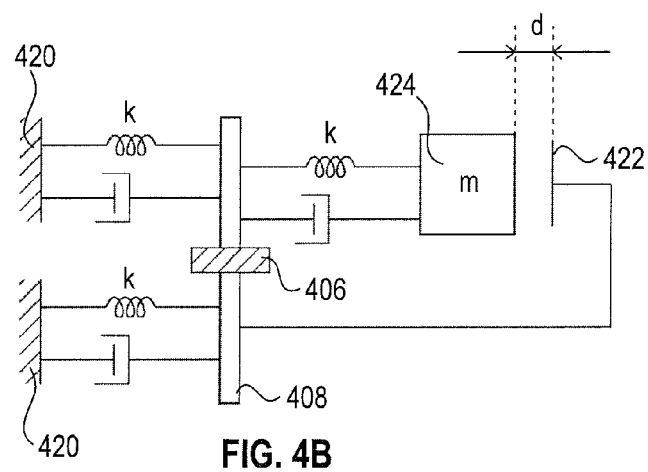
FIG. 4B illustrates a diagram modeling a MEMS transducer having a suspended electrode and a suspended resonator consistent with at least one embodiment of the invention.
Figure 4C:
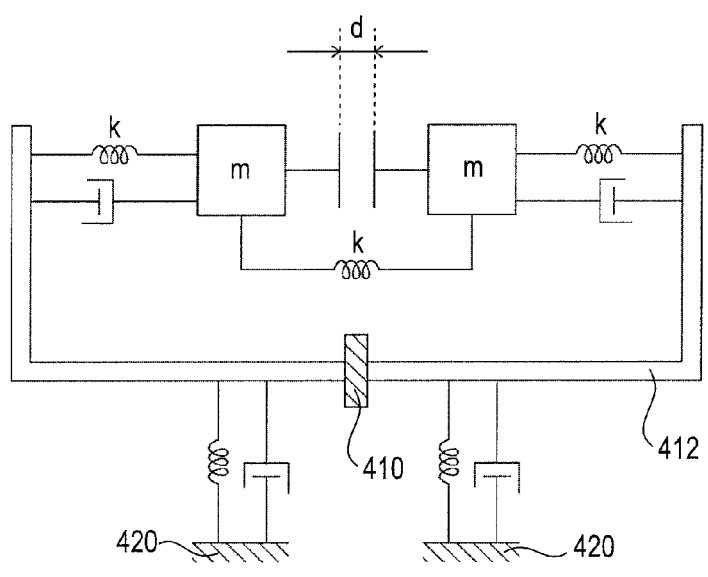
FIG. 4C illustrates a diagram modeling a MEMS transducer having a suspended electrode and a suspended resonator in a coupled electrode configuration consistent with at least one embodiment of the invention.

Referring to FIG. 4B, a suspended electrode (represented by plate 422 coupled to a spring-damper system) and suspended body (represented by mass 424 coupled to a spring-damper system) configuration results in a transducer gap, d, that only depends on the topological mismatch between electrode and body. The suspended electrode and body are electrically isolated and mechanically coupled by electrically insulating material 406 in mechanical suspension 408. The topological mismatch (e.g., electrode and body mismatch due to stress) can be tailored or nulled out by design. Referring to FIG. 4C, in a coupled electrode resonant mode, each electrode is a resonant body and is mechanically coupled to the other electrode to achieve the target resonant mode shape. The electrodes are electrically isolated and mechanically coupled using electrically insulating material 410 in mechanical suspension 412.

Figure 5:
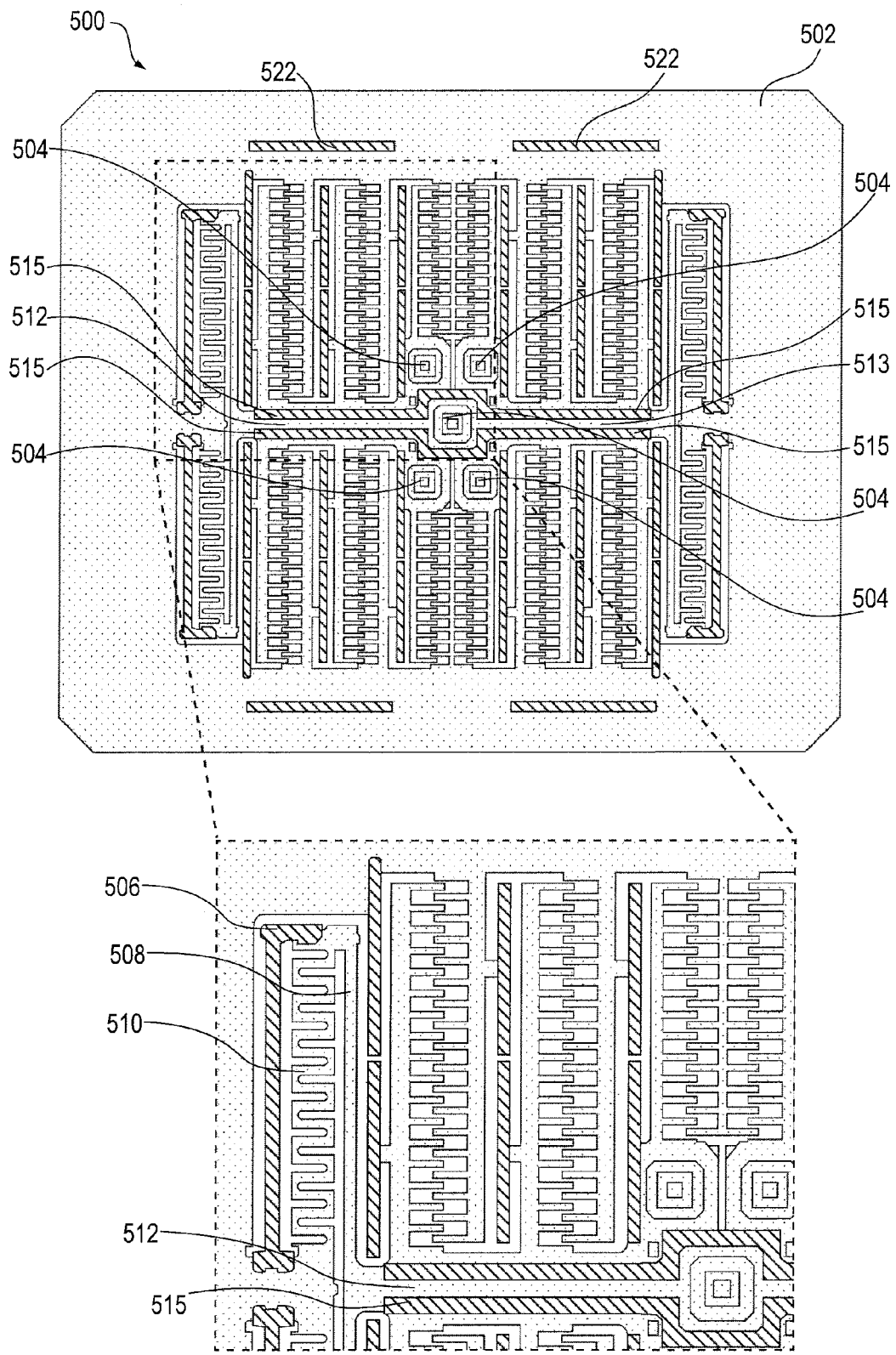
FIG. 5 illustrates a plan view of a MEMS transducer having a suspended electrode and resonator in a coupled electrode configuration consistent with at least one embodiment of the invention.

FIG. 5 illustrates an exemplary embodiment of a low frequency resonator having a suspended electrode and a suspended body (i.e., resonator or mass). Low frequency resonators are typically sensitive to frequency shift due to strain because of their low stiffness. MEMS device 500 includes a comb drive transducer, which is used in some applications for improved linearity of capacitance as a function of displacement. The electrodes and resonator of MEMS device 500 include electrically conductive comb structures, which include rows of electrode teeth that interlock, but do not touch, rows of body teeth. The body and electrodes move longitudinally, in-plane. However, techniques described herein may be adapted to embodiments of a MEMS device including parallel plate transducers and/or those in which the body and/or electrodes move out-of-plane.

Still referring to FIG. 5, in MEMS device 500, suspension beams 512 and 513 include signal routing that extends through center anchor 504 of body 502. Body 502 includes folded beam springs. Alternately, the suspension beams made from different materials may be configured in parallel physically and mechanically, instead of the folded spring shown having suspension beams mechanically in series but physically parallel. In the alternate case, the signal routing portion is not needed. Location of center anchor 504 in the center of the body reduces transfer of mechanical stress to the vibrating structure. Center anchor 504 is a monolithic structure, including multiple mechanically coupled portions. However, center anchor 504 is partitioned into multiple electrically isolated portions (e.g., portions including contacts 503, 505, 507, 509, and 511 to separate electrical domains for a first electrode, a body, and a second electrode, described further below with reference to FIGS. 6A-6C). Referring back to FIG. 5, the relatively large mass per area of the body of MEMS device 500 increases the stiffness of the folded beam for a given frequency, thereby reducing frequency variation due to strain as compared to MEMS devices having less mass for the same target frequency. Body 502 of MEMS device 500 also includes embedded embedded electrical insulator material slits 522 to match the static deflection of the suspension beam in order to align individual transducer faces once residual stress is relieved in the entire structure, as discussed further below. Note that in FIG. 5, electrically insulating material is shaded with hatching and electrically conductive material is shaded with dots. The unshaded gaps, e.g., between the electrode teeth and body teeth, may contain air or other fluid.

Figure 6A:
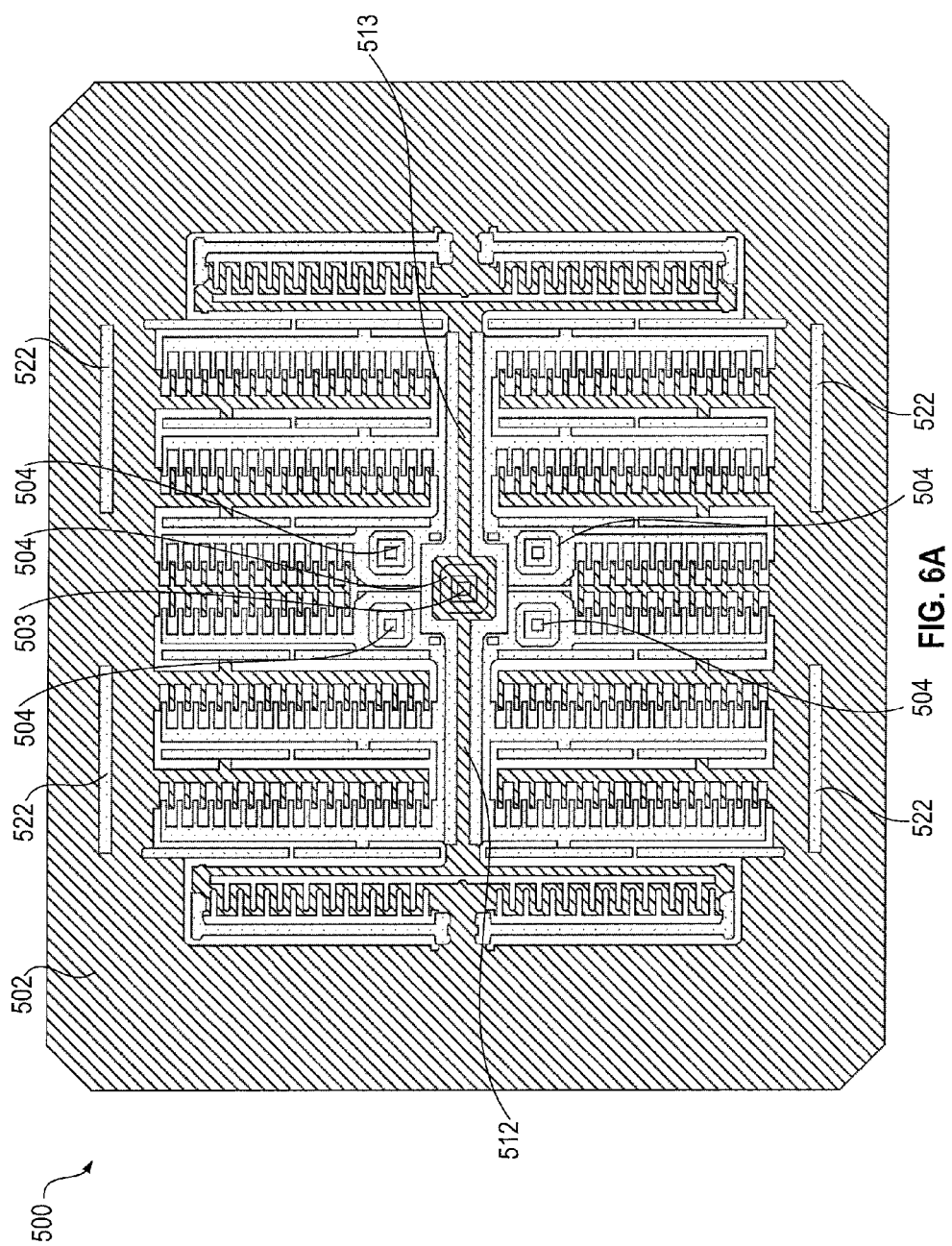
FIGS. 6A-6D illustrates various features of the MEMS transducer of FIG. 5 having a suspended electrode and resonator in a coupled electrode configuration consistent with at least one embodiment of the invention.

Referring to FIGS. 5 and 6A-6E, various features of MEMS device 500 are illustrated. Referring to FIG. 6A, electrically conductive portions of body 502 are coupled to a first electrical domain via contact 503 of center anchor 504. Body 502 is suspended from the substrate by suspension beams 512 and 513 extending between center anchor 504 and ends of body 502. The hatched regions of MEMS device 500 in FIG. 6A indicate those portions of MEMS device 500 that are coupled to the first electrical domain, other portions of MEMS device 500 (electrically conductive and electrically insulating) are indicated with dots, and unshaded gaps, e.g., between the electrode teeth and body teeth, may contain air or other fluid. Referring back to FIG. 5, conductive portions of suspension beams 512 and 513 are delineated as part of the first electrical domain by electrically insulating material embedded in suspension beams 512 and 513 (indicated by hatching in FIG. 5). Other portions of suspension beams 512 and 513 are electrically isolated from the first electrical domain by that embedded electrically insulating material. Body 502 includes conductive finger structures that are interdigitated with conductive finger structures of electrodes to form comb drive transducers.

Figure 6B:
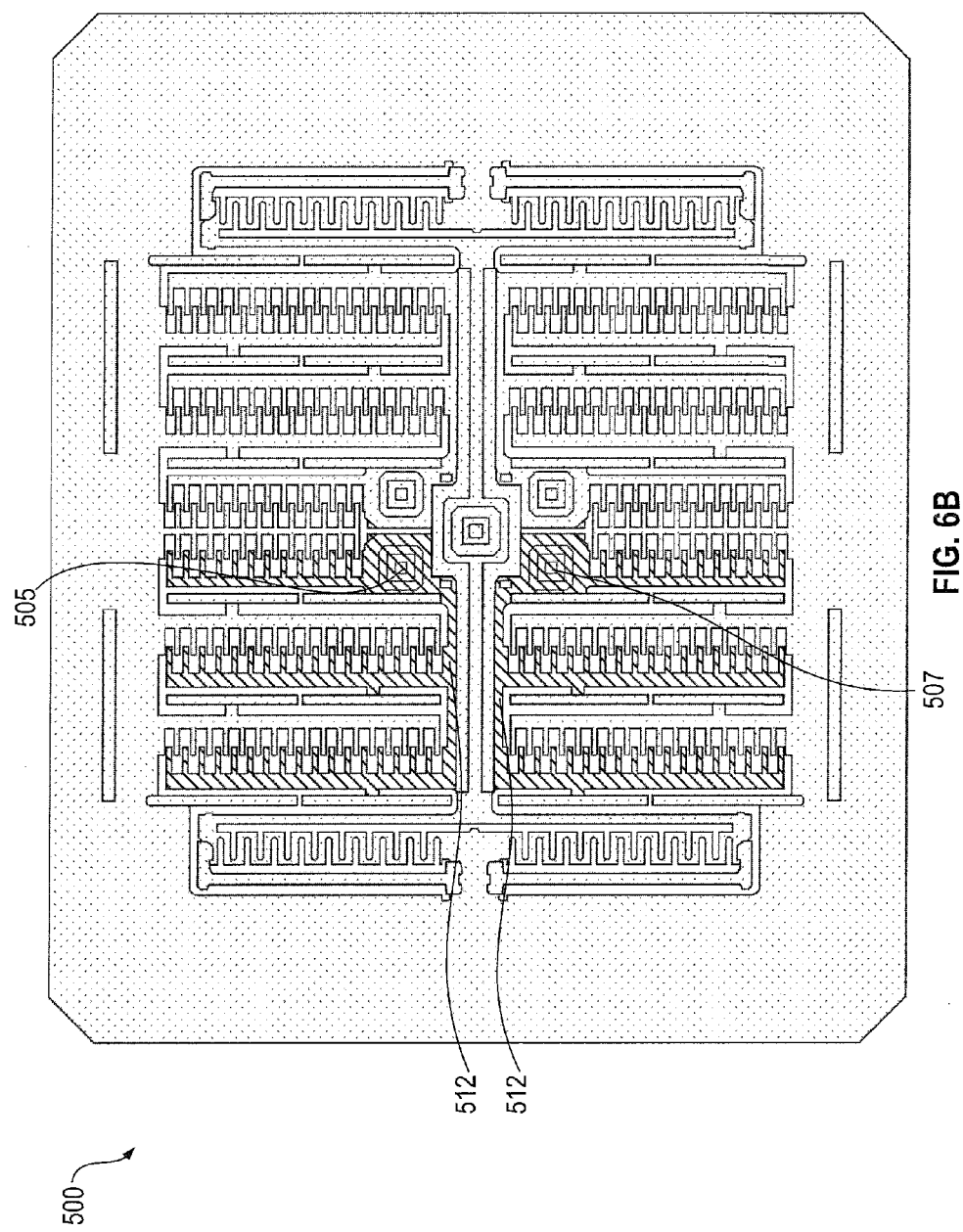

Referring to FIG. 6B, a first electrode of MEMS device 500 is coupled to a second electrical domain via contacts 505 and 507 of center anchor 504. Portions of the first electrode are suspended from the substrate by suspension beam 512 extending between the center anchor structure and ends of the body. The hatched regions of MEMS device 500 in FIG. 6B indicate those portions of MEMS device 500 that are coupled to the second electrical domain, other portions of MEMS device 500 (electrically conductive and electrically insulating) are indicated with dots, and unshaded gaps, e.g., between the electrode teeth and body teeth, may contain air or other fluid. Referring back to FIG. 5, suspension beam 512 includes conductive portions that are defined as part of the second electrical domain by electrical isolation material 515 embedded in suspension beam 512. However, other portions of suspension beam 512 are electrically isolated from the second electrical domain by that embedded electrical isolation material. The first electrode includes conductive finger structures that are interdigitated with conductive finger structures of body 502 to form comb drive transducers.

Figure 6C:
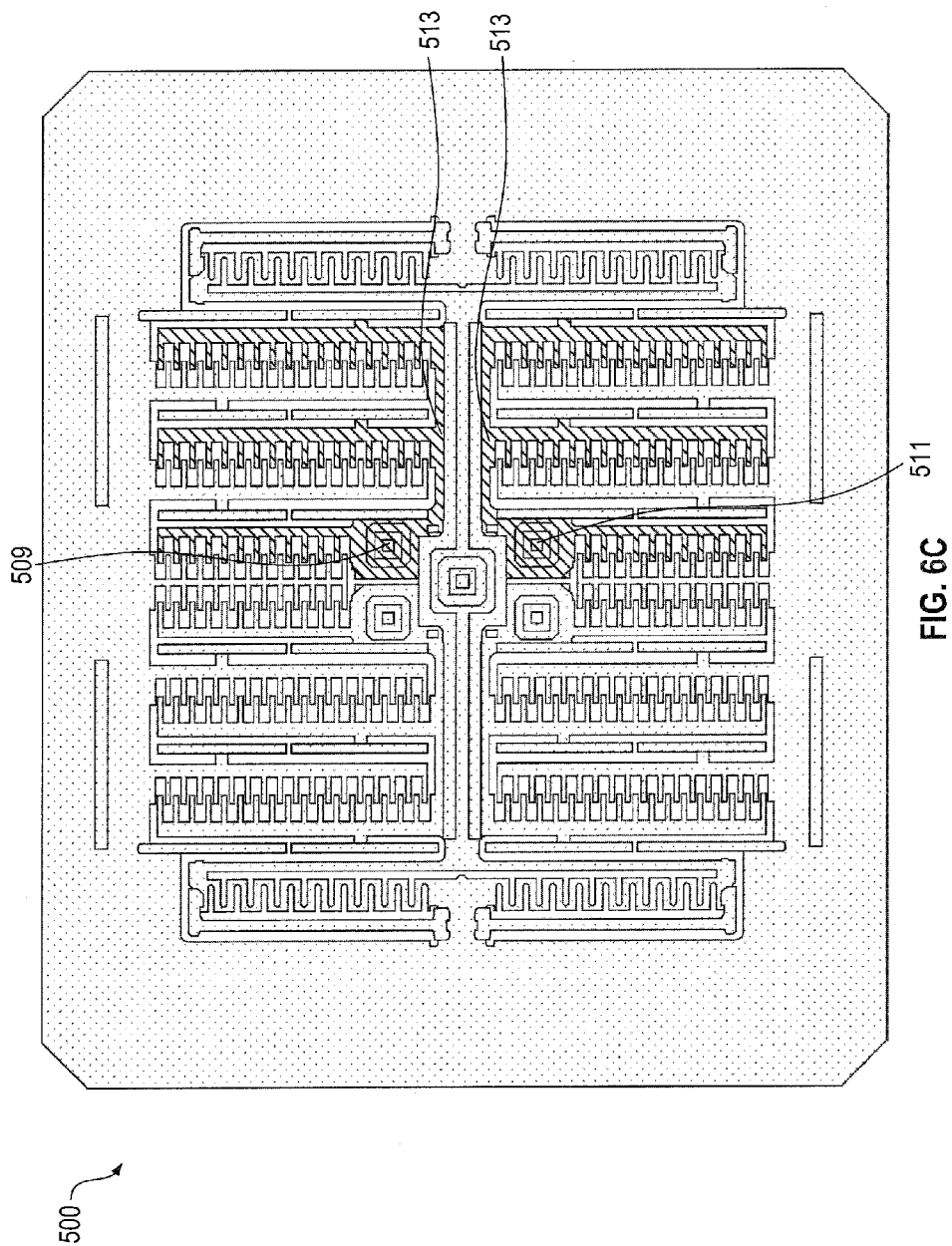
Figure 6D:
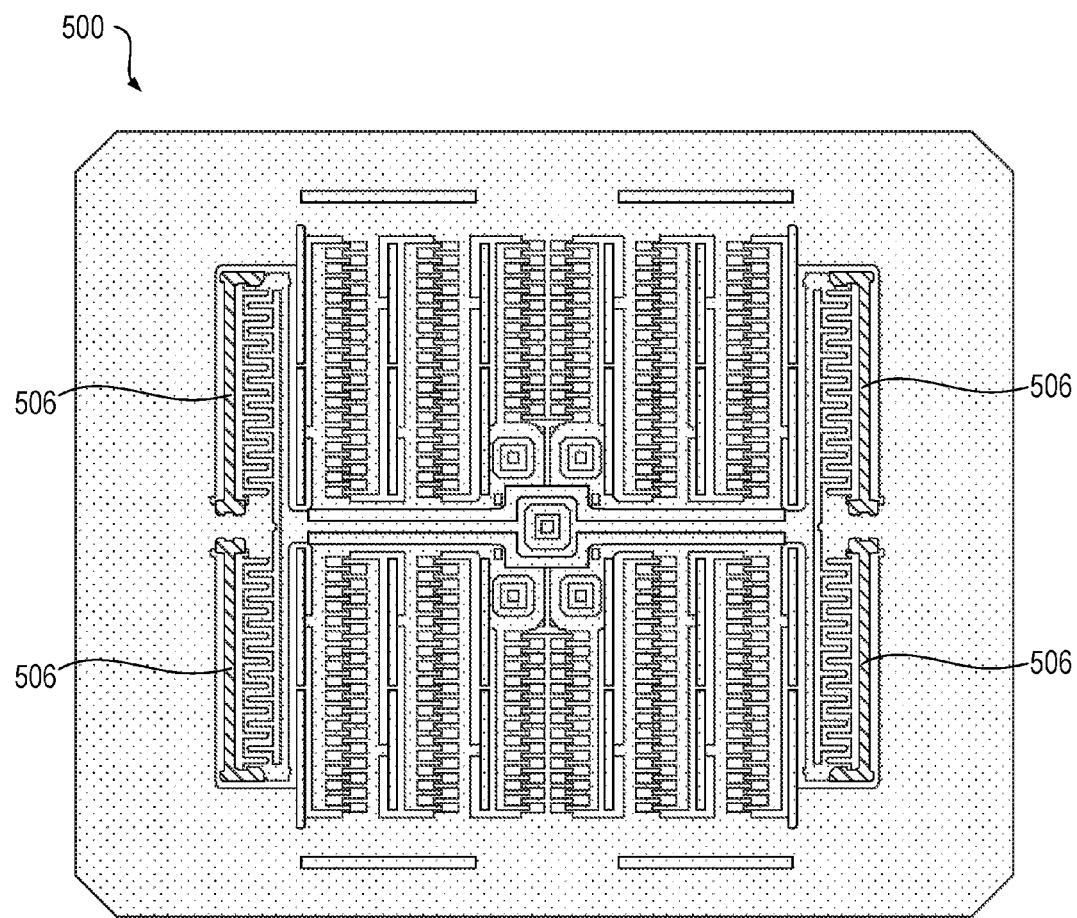

Referring to FIG. 6C, a second electrode of MEMS device 500 is coupled to a third electrical domain via contacts 509 and 511 of center anchor 504. Portions of the second electrode are suspended from the substrate by suspension beam 513 extending between the center anchor structure and ends of body 502. The hatched regions of MEMS device 500 in FIG. 6C indicate those portions of MEMS device 500 that are coupled to the third electrical domain, other portions of MEMS device 500 (electrically conductive and electrically insulating) are indicated with dots, and unshaded gaps, e.g., between the electrode teeth and body teeth, may contain air or other fluid. Referring back to FIG. 5, suspension beam 513 includes conductive portions that are defined as part of a third electrical domain by electrical isolation material 515 embedded in suspension beam 513. However, other portions of suspension beam 513 are electrically isolated from the third electrical domain by embedded electrical isolation material. The second electrode includes conductive finger structures that are interdigitated with conductive finger structures of body 502 to form the comb drive transducers.

Figure 6E:
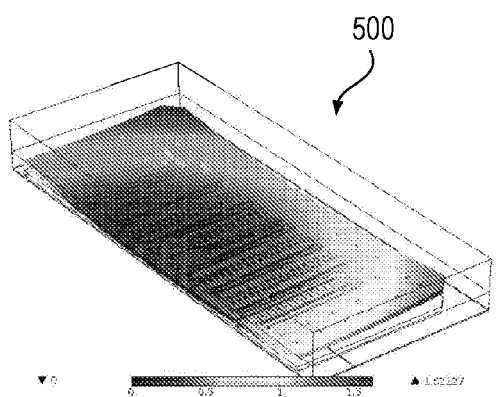
FIG. 6E illustrates static deflection after stress relief of the MEMS transducer of FIG. 5 having a suspended electrode and resonator in a coupled electrode configuration consistent with at least one embodiment of the invention.

Still referring to FIG. 5, MEMS device 500 includes a folded beam structure. As discussed above, MEMS device 500 includes electrically insulating material portions (indicated by hatching in FIG. 5) in the suspension beams 512 and 513 to allow separate signal routing to the body and the electrodes. Those electrically insulating material portions may affect the strain gradient of the suspension beams. If the strain gradients between the suspension beams and the body are not matched, those electrically insulating material portions may cause the suspension beams to curl differently with respect to the body, resulting in a misalignment of the electrode and body at the transducer gap of the comb drive transducers, thereby reducing transducer efficiency. Referring to FIGS. 5 and 6E, to compensate for changes in strain gradient with respect to the body due to electrical insulator material in suspension arms of MEMS device 500, body 502 includes embedded electrical insulator material slits 522. Those electrically insulating material slits have geometries that match a strain gradient of the body to the strain gradient in the suspension beams. As a result of the design features of MEMS device 500, the static deflection of portions of MEMS device 500 including the electrodes is matched to the static deflection of the body in the out-of-plane direction, as illustrated by the static deflection map of FIG. 6E.

Figure 7A:
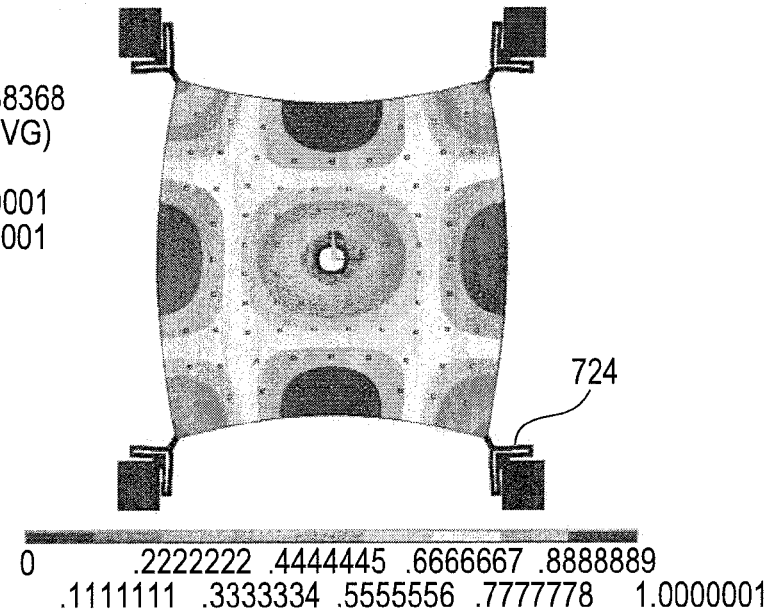
FIG. 7A illustrates dynamic mode shape of a high frequency MEMS transducer without suspended electrodes.
Figure 7B:
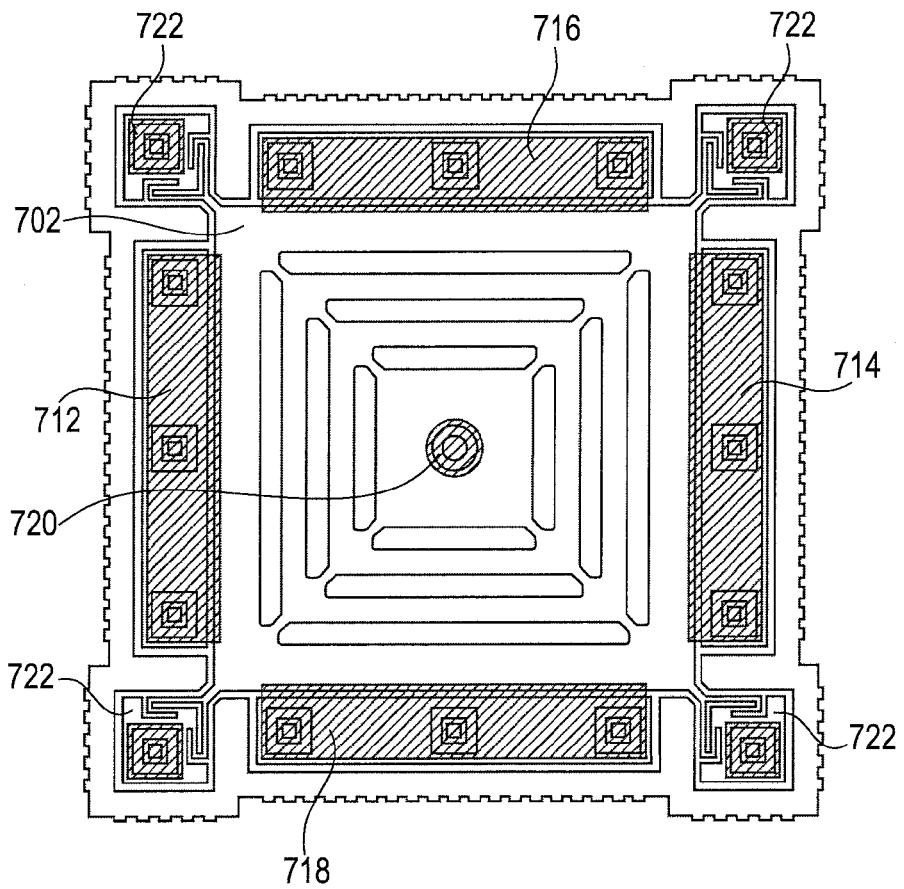
FIG. 7B illustrates a plan view of the high frequency MEMS transducer without suspended electrodes of FIG. 7A.

Referring to FIGS. 7A and 7B, MEMS device 700 is an exemplary high-frequency resonator including a suspended mass having multiple anchors but without suspended electrodes. The displacement profile of FIG. 7A illustrates the target mode shape of the basic shape structure. Each of electrodes 712, 714, 716, and 718 are independently anchored to the substrate by multiple anchors, which include contacts to corresponding electrical domains. Plate resonator 702 is separately anchored to the substrate by a five-point anchoring technique including central anchor 720 and an anchor 722 at each corner of the plate. Each corner anchor includes a decoupling spring 724 and an electrical connection to a corresponding domain.

Figure 8A:
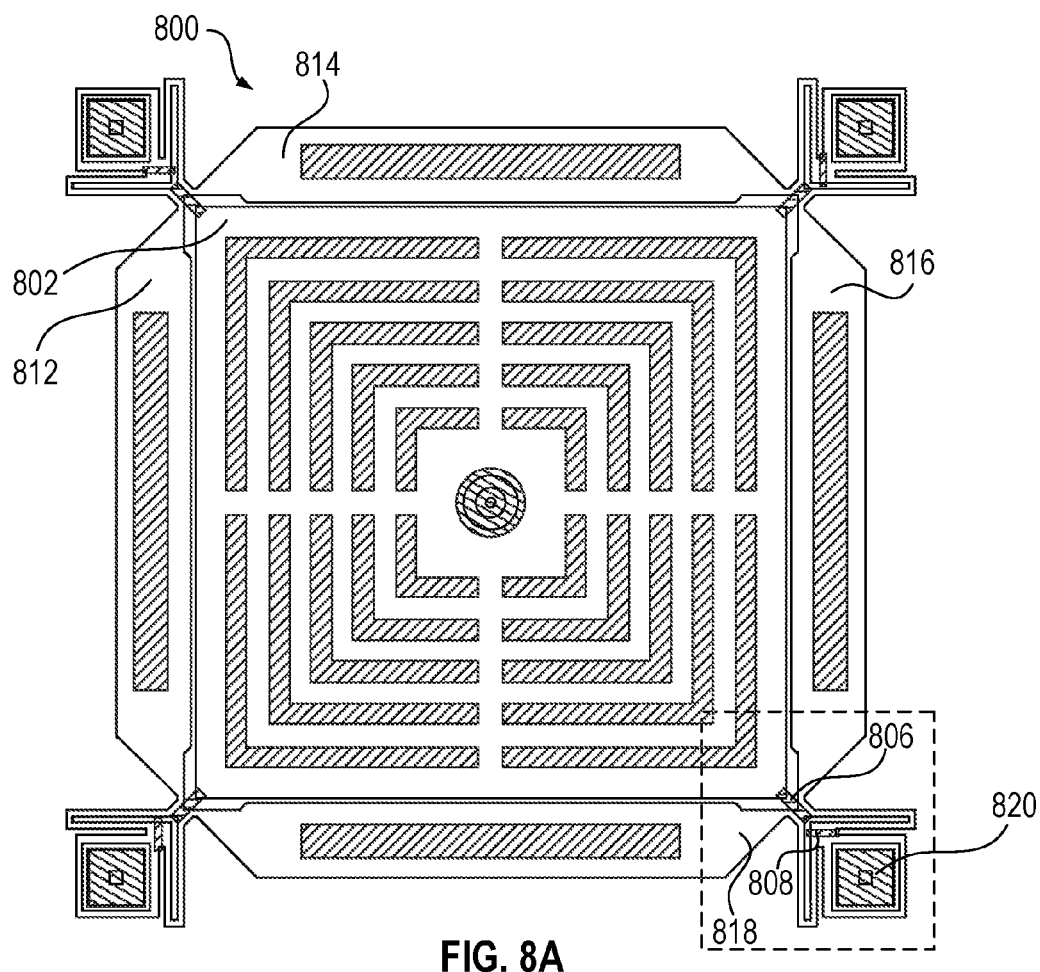
FIGS. 8A and 8B illustrate a plan view of a high frequency MEMS transducer with suspended electrodes consistent with at least one embodiment of the invention.
Figure 8B:
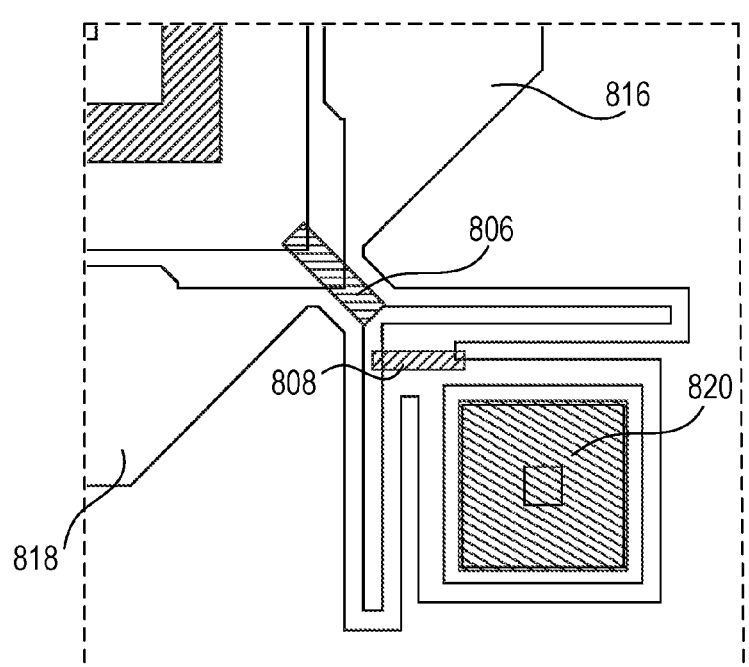

FIGS. 8A and 8B illustrate an exemplary high-frequency MEMS device 800 including a suspended body and suspended electrodes that are mechanically coupled to each other using electrically insulating material portions 806. Plate resonator 802 is anchored to the substrate by a central anchor, which also includes an electrical contact to a first electrical domain. The four corner anchors are mechanically coupled to plate resonator 802 using electrically insulating material portions, but electrically isolated from plate resonator 802 by electrically insulating material portions. Each of the corner anchors electrically couples an electrical domain to one of the electrodes (e.g., electrode 816) mechanically coupled to the anchor. Each corner anchor also includes an electrically insulating material portion 808 that electrically isolates that electrical domain from another electrode mechanically coupled to the anchor (e.g., electrode 818). Thus, the design of MEMS device 800 reduces or eliminates frequency variation due to strain.

Figure 9:
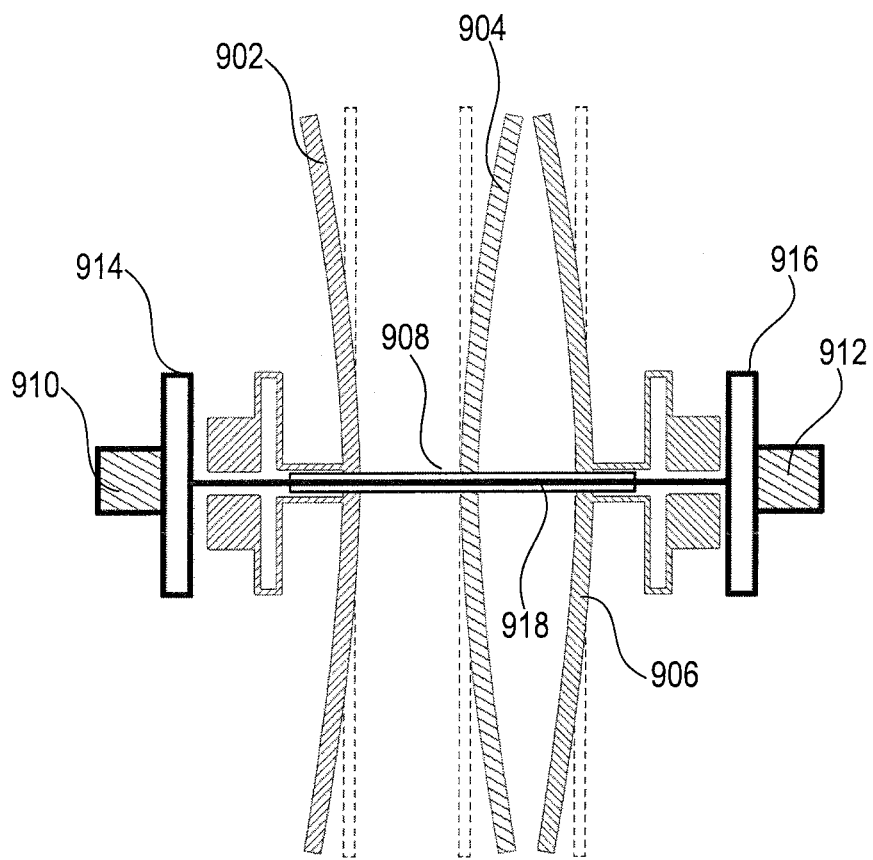
FIG. 9 illustrates a coupled electrode device consistent with at least one embodiment of the invention.

The techniques described above may be applied to other types of MEMS devices. Electrodes may be suspended above a substrate and mechanically referenced with respect to a suspended resonator beam to reduce frequency variation due to strain. Referring to FIG. 9, a flexural device includes suspended body beam 904 between suspended electrode beam 902 and suspended electrode beam 906. Unlike MEMS devices 500, 700, and 800, which may be modeled as the system of FIG. 4B having stationary electrodes, MEMS device 900 includes a body and electrodes that vibrate together (i.e., form a vibration mode together). In MEMS device 900, suspended electrodes beams 902 and 906 are tuning-fork-like structures that in conjunction with suspended body beam 904, form a resonator and a transducer at the same time. Such beam structures may be used in gyroscopes and low-frequency timing structures. Suspended body beam 904 and suspended electrode beams 902 and 906 are electrically isolated and mechanically coupled by electrically insulating material portion 908. Any substrate strain causes the electrodes to move together. Thus the electrodes are self-referenced and MEMS device 900 is strain insensitive. Each of the beams is associated with a different electrical domain, but are mechanically coupled to each other. Electrically insulating material portion 908 mechanically couples suspended body beam 904 and the suspended electrode beams 902 and 906. Routing signal 918 travels through electrically insulating material portion 908 and couples suspended body beam 904 to anchors 910 and 912, which are mechanically decoupled from suspended body beam 904 by decoupling springs 914 and 916 to reduce transfer of strain from the substrate to suspended body beam 904 and include electrical contacts to a corresponding electrical domain. Unlike conventional MEMS structures, the electrode beams and body beam of MEMS device 900 vibrate together and device 900 has reduced strain sensitivity as compared to conventional MEMS devices since any movement due to strain will cause the electrode beams and body beam to move in a similar manner. Although the mechanical coupling and electrical isolation of electrodes and body structures are illustrated for a flexural device, the techniques described herein may be adapted for bulk acoustic mode devices in which the electrically insulating material structure may be designed as part of the mode shape.

Referring back to FIGS. 5 and 6D, in at least one embodiment, MEMS device 500 includes multiple temperature compensation structures, portions of which are hatched in FIG. 6D. An individual temperature compensation structure includes independent beams having different stiffness variations as a function of temperature (i.e., different Young's modulus temperature coefficients). In at least one embodiment of the temperature compensation structure, a first material forming beam 508 has a different Young's modulus temperature coefficient than second material forming beam 506. The Young's modulus temperature coefficient of the first material need only be different than that of the second material over the operational range of the MEMS device. Any material having a different Young's modulus temperature coefficient than first material over the typical operating range (e.g., approximately −40° C. to approximately 85° C. or approximately −55° C. to approximately 125° C.) may be employed as second material. In at least one embodiment of the temperature compensation structure, the second material has a negative Young's modulus temperature coefficient, while the first material has a positive Young's modulus temperature coefficient. In at least one embodiment of the temperature compensation structure, beam spring 508 is formed from the structural material, which may be a semiconductor such as, but not limited to, silicon (Si), germanium (Ge), and SiGe alloys, and beam spring 506 is formed from the electrically insulating material, which may be $SiO_2$ and indicated by hatching in FIGS. 5 and 6D. Note that silicon dioxide has the unusual property of becoming stiffer as temperature increases. In other embodiments of the temperature compensation structure, beam spring 506 is formed from other materials, which may have positive or negative Young's modulus temperature coefficients.

The temperature compensation structure may include routing spring 510, which dominates the electrical behavior of the temperature compensation structure. That is, routing spring 510 is a serpentine structure formed from the structural material and serves to electrically couple the body to the electrical domain of the center anchor. Routing spring 510 has a much higher compliance than beam spring 506 and beam spring 510. Thus routing spring 510 does not substantially influence the mechanical behavior but dominates the electrical behavior of the temperature compensation structure. Beam spring 506 and beam spring 508 have a higher stiffness than routing spring 510 and thus dominate the mechanical behavior of the temperature compensation structure. Note that the beam springs may be coupled mechanically in series or in parallel to form a spring that supports the movable body and beam springs and routing spring may have other geometries. The temperature compensation structure is selectively located to specific regions of MEMS device 500 and beam springs 506 and 508 are dimensioned to modify the temperature response of MEMS device 500 (e.g., the temperature coefficient of frequency of a resonator) independent of other properties of the MEMS device (e.g., a resonator mode shape).

This approach can simplify design as compared to other temperature compensation techniques that use strips of silicon dioxide surrounded by silicon germanium on either side or surrounded by strips of silicon germanium. The dual beam technique may also substantially reduce the amount of interface between the two materials. The silicon germanium—silicon dioxide interface can introduce undesirable effects such as locally varying properties and the generation of mechanical weak points and stress concentrations. Having separate spring portions facilitates moving structural weak points and stress concentration features to less critical locations. The separate beam approach to temperature compensation can reduce thermoelastic energy losses and thus damping at silicon germanium—silicon dioxide interface, thereby increasing the quality factor of the resonator, which is a metric for short-term stability. The separate beam technique may also improve design flexibility by allowing independent selection of silicon dioxide and silicon germanium beam dimensions, thereby expanding the design space available to achieve temperature compensation at any particular frequency. Unlike temperature compensation techniques that use strips of oxide surrounded by other material, the dual-beam technique may be easily adapted to compensate for effects of temperature variations in MEMS devices that use slender flexural beams, e.g., inertial sensors. In addition, the dual-beam technique is less sensitive to some manufacturing tolerances, e.g., pattern alignment of silicon dioxide to silicon germanium.

Referring to FIGS. 10A and 10B, electrical insulator material embedded in a MEMS structural layer is used to form a suspended passive element (e.g., suspended resistor 1002) that is mechanically coupled to a central beam of the resonator. Embedded electrical insulator traces 1006 and 1007 electrically isolate and mechanically couple a serpentine portion of structural material traces to form suspended resistors 1002 and 1003. Suspended resistors 1002 and 1003 are mechanically anchored to the substrate by contacts 1008 and 1010 and contacts 1012 and 1014, respectively. Contacts 1008 and 1010 and contacts 1012 and 1014 serve as the electrical terminals of suspended resistors 1002 and 1003, respectively.

Figure 10C:
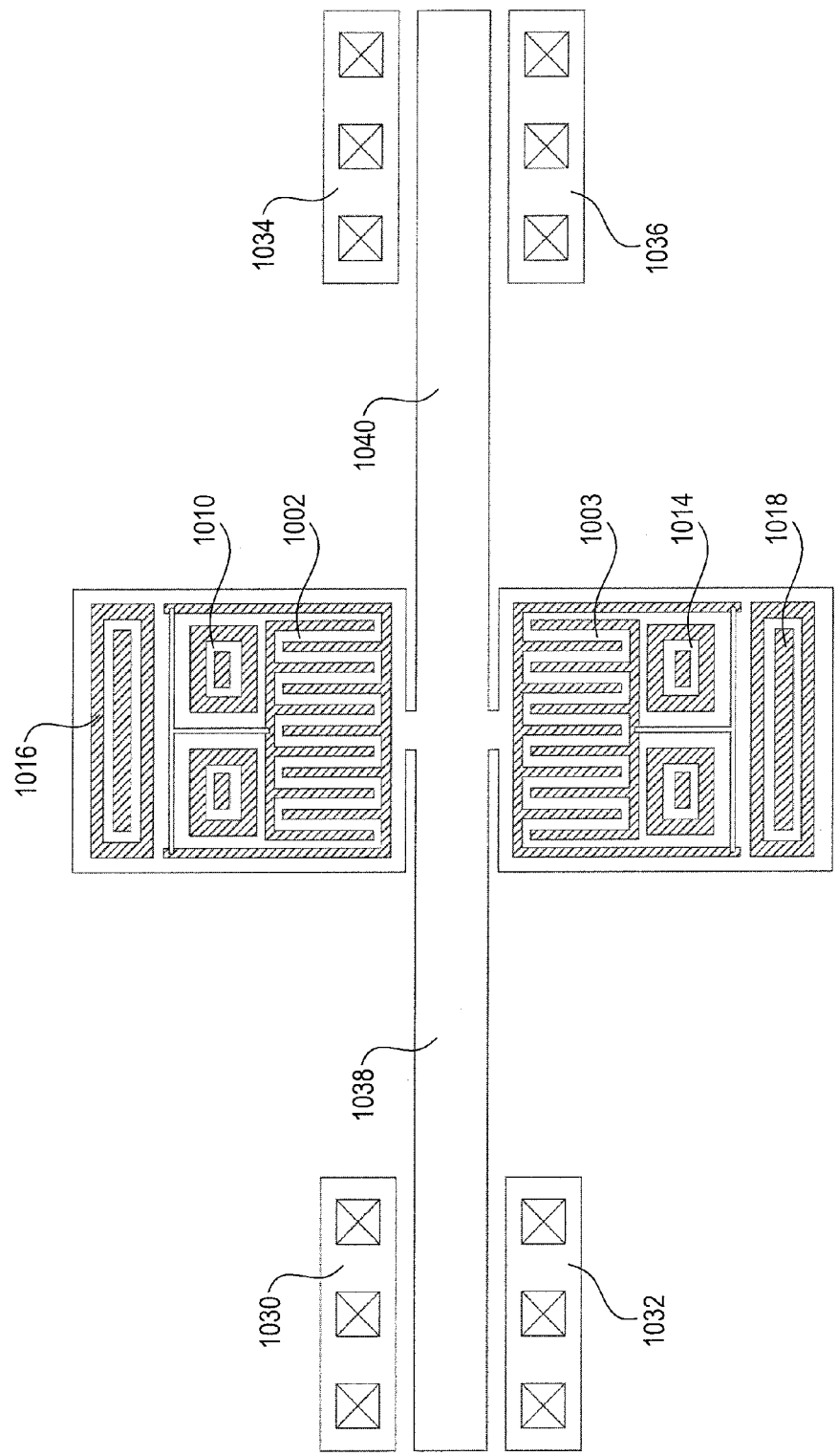
FIG. 10C illustrates a suspended resistor device and a MEMS transducer having lateral electrodes consistent with at least one embodiment of the invention.
Figure 11:
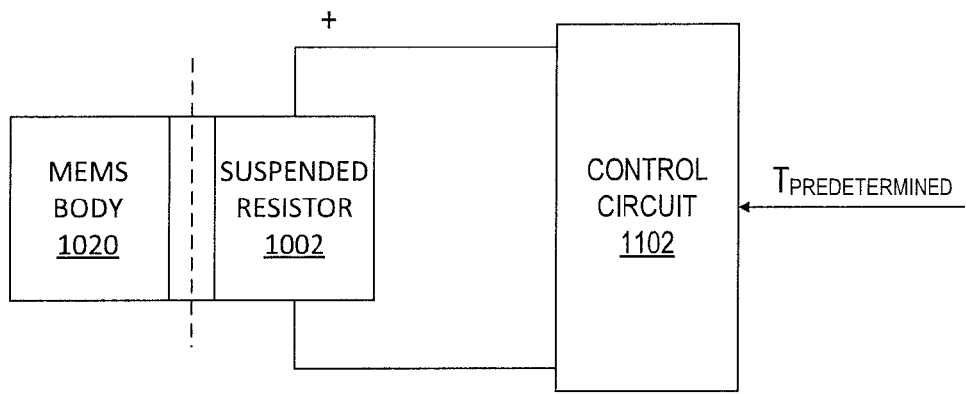
FIG. 11 illustrates a circuit including a suspended passive element configured as an integrated heater consistent with at least one embodiment of the invention.

Referring to FIGS. 10A, 10C, and 11, suspended resistors 1002 and/or 1003 may be configured to maintain constant or otherwise adjust a temperature of MEMS device 1000 by regulating power dissipation into the body 1020. For example, control circuit 1102 receives an indication of a predetermined temperature and configures suspended resistor 1002 to adjust temperature of MEMS device 1000 using a voltage drop across suspended resistor 1002. Suspension of the resistor from the substrate improves thermal isolation and using a relatively small thermal mass as compared to heaters that are embedded in a substrate. The smaller thermal mass is needed to make wafer level calibration practical by keeping heating currents low. The suspended resistor allows on-chip, wafer-level calibration of a resonator with a relatively small thermal mass.

Figure 12:
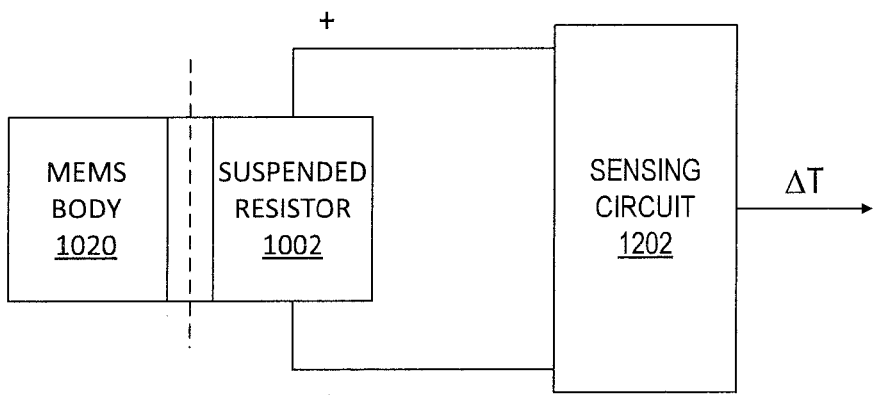
FIG. 12 illustrates a circuit including a suspended passive element and a temperature sensing circuit consistent with at least one embodiment of the invention.

Referring to FIGS. 10A, 10C, and 12, in another embodiment of MEMS device 1000, suspended resistors 1002 and/or 1003 are thermally coupled to MEMS device 1000 and configured to characterize the temperature response of MEMS device 1000. For example, suspended resistors 1002 and 1003 may be used as a temperature sensor element (i.e., a thermistor) of a bridge temperature sensor (e.g., sensing circuit 1202). A change in temperature of body 1020 will cause a corresponding change in the resistance of suspended resistors 1002 and 1003 by an amount characterized by the temperature coefficient of resistance (TCR) of the structural material (e.g., SiGe). That temperature change can be determined based on a voltage drop across the resistor, a predetermined resistance value at a predetermined temperature, and the TCR of the structural material. When used as a temperature sensor, the suspended resistor technique allows placement of the sensing element proximate to the element (e.g., MEMS resonator 1000) that is having its temperature sensed and/or compensated. Mechanically coupling the resistor to the central beam of the device, via electrically isolating material portions, reduces effects of strain on the temperature measurement. Such placement reduces thermal gradients and associated temperature measurement errors, which results in a sensor that is more accurate over temperature than other sensors and measures temperature where it matters, i.e., at the location of the device that needs compensation for temperature shifts.

MEMS device 1000 is an exemplary lattice transducer that may be configured to generate a target frequency using a torsional mode or a flexural mode. MEMS device 1000 includes body 1020 formed from lattice beams that are suspended from the substrate. Body 1020 is anchored to the substrate by anchors 1016 and 1018, which are coupled to body 1020 by decoupling springs. Anchors 1016 and 1018 also provide electrical contact to the body 1020. The lattice beams of body 1020 form substantially square lattice openings that surround, but do not touch, corresponding electrodes that are anchored to the substrate. Each substantially square lattice opening forms a transducer gap along the perimeter of the opening and the perimeter of the substantially square electrode 1022. Note that the perimeter of the lattice openings and the perimeter of the electrodes have a varied perimeter that increases the area of the transducers. However, the perimeters of the lattice openings and the electrodes may have other geometries. MEMS device 1000, as illustrated, includes eighteen transducers on each side of the center anchors 1016 and 1018, however, the number of transducers is exemplary only and may vary according to application.

Figure 13:
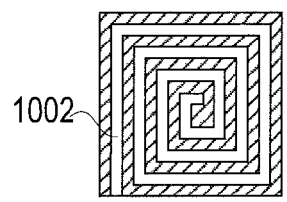
FIG. 13 illustrates a suspended spiral inductor consistent with at least one embodiment of the invention.

Although the suspended passive element technique is illustrated in an embodiment including a lattice transducer, the suspended passive element technique may be incorporated into MEMS devices having any type of transducers and/or having mechanically coupled electrodes and body (e.g., MEMS device 500). For example, FIG. 10C illustrates the suspended passive resistor in an embodiment including beams 1038 and 1040 and lateral electrodes 1030, 1032, 1034, and 1036. In addition, although techniques described above illustrate the use of insulator material embedded in a MEMS structural layer to form electrostatic transducers and suspended resistors, the technique may be used for other types of passive elements or suspended resistors having other geometries, which may be used in filters, switches, or other applications. For example, referring to FIGS. 10A, 10C, and 13, by using a structural material that has a low resistivity, the technique may be used to form suspended inductors (e.g., planar spiral inductors) that have a high quality factor (i.e., low eddy currents) or to form electromechanical switches that are strain free for improved manufacturability, lower switching voltages, and improved reliability (e.g., reduced risk of stiction).

The description of the invention set forth herein is illustrative, and is not intended to limit the scope of the invention as set forth in the following claims. For example, while the invention has been described in embodiments in which specific MEMS structures (e.g., comb drive, parallel plate, and lattice transducers) and materials (e.g., SiGe and $SiO_2$) are used, one of skill in the art will appreciate that the teachings herein can be utilized with other types of MEMS structures and materials. Variations and modifications of the embodiments disclosed herein, may be made based on the description set forth herein, without departing from the scope and spirit of the invention as set forth in the following claims.

What is claimed is:

1. An apparatus comprising:
 a microelectromechanical system (MEMS) device comprising:
   a first electrode and a second electrode; and
   a body suspended from a substrate of the MEMS device, the body and the first electrode forming a first electrostatic transducer, and the body and the second electrode forming a second electrostatic transducer; and
 a suspended passive element mechanically coupled to the body and electrically isolated from the body.

2. The apparatus, as recited in claim 1, wherein the suspended passive element is a suspended resistor comprising a serpentine structural material portion attached to electrically insulating material portions.

3. The apparatus, as recited in claim 2, further comprising:
 a circuit comprising the suspended resistor, the circuit being configured to detect a temperature change of the MEMS device.

4. The apparatus, as recited in claim 2, further comprising:
 a circuit comprising the suspended resistor, the circuit being configured to adjust a temperature of the MEMS device.

5. The apparatus, as recited in claim 1, wherein the suspended passive element is mechanically coupled to a central beam of the body.

6. The apparatus, as recited in claim 1, wherein the suspended passive element is a suspended inductor mechanically coupled to the body and electrically isolated from the body.

7. The apparatus, as recited in claim 6, wherein the suspended inductor comprises a planar spiral structural material portion attached to electrically insulating material portions.

8. The apparatus, as recited in claim 1, wherein the suspended passive element is electrically conductive and electrically isolated from the first and second electrodes.

9. A method of manufacturing an apparatus comprising:
 forming a microelectromechanical system (MEMS) device comprising:
   a first electrode and a second electrode; and
   a body suspended from a substrate of the MEMS device, the body and the first electrode forming a first electrostatic transducer, and the body and the second electrode forming a second electrostatic transducer; and forming a suspended passive element mechanically coupled to the body and electrically isolated from the body.

10. The method, as recited in claim 9, wherein the suspended passive element is a suspended resistor comprising a serpentine structural material portion attached to electrically insulating material portions.

11. The method, as recited in claim 9,
wherein forming the MEMS device comprises forming a structural layer using the substrate; and
wherein forming the suspended passive element comprises forming electrical insulator material embedded in the structural layer.

12. The method, as recited in claim 11, wherein forming the suspended passive element comprises releasing the structural layer.

13. The method, as recited in claim 9, further comprising:
forming a circuit portion, the circuit portion being configured to detect a temperature change of the MEMS device using the suspended passive element.

14. The method, as recited in claim 9, further comprising:
forming a circuit portion, the circuit portion being configured to adjust a temperature of the MEMS device using the suspended passive element.

15. The method, as recited in claim 9, wherein the suspended passive element is a suspended inductor mechanically coupled to the body and electrically isolated from the body.

16. The method, as recited in claim 9, wherein the suspended passive element is mechanically coupled to a central beam of the body.

17. The method, as recited in claim 9, wherein the suspended passive element is formed from a structural material having a low resistivity.

18. The method, as recited in claim 9, wherein the suspended inductor comprises a planar spiral structural material portion attached to electrically insulating material portions.

19. An apparatus comprising:
means for vibrating, wherein the means for vibrating is suspended from a substrate;
means for electrostatically driving the means for vibrating;
means for electrostatically sensing vibrations of the means for vibrating; and
means for passively transferring energy from a first node to a second node, the means for passively transferring energy being suspended from the substrate and being mechanically coupled to and electrically isolated from the means for vibrating.

20. The apparatus, as recited in claim 19, wherein the means for passively transferring energy comprises:
means for heating the means for vibrating, wherein the means for heating is suspended from the substrate; and
means for mechanically coupling and electrically isolating the means for vibrating to the means for heating.

21. The apparatus, as recited in claim 19, wherein the means for passively transferring energy comprises:
means for sensing temperature variations of the means for vibrating, wherein the means for sensing temperature variations is suspended from the substrate; and
means for mechanically coupling and electrically isolating the means for vibrating to the means for sensing temperature variations.

* * * * *